(12) United States Patent
Höppel et al.

(10) Patent No.: US 9,299,897 B2
(45) Date of Patent: Mar. 29, 2016

(54) OPTOELECTRONIC SEMICONDUCTOR CHIP HAVING A PLURALITY OF ACTIVE REGIONS ARRANGED ALONGSIDE ONE ANOTHER

(71) Applicant: OSRAM Opto Semiconductors GmbH, Regensburg (DE)

(72) Inventors: Lutz Höppel, Alteglofsheim (DE); Alexander F. Pfeuffer, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/428,333

(22) PCT Filed: Sep. 19, 2013

(86) PCT No.: PCT/EP2013/069472
§ 371 (c)(1),
(2) Date: Mar. 13, 2015

(87) PCT Pub. No.: WO2014/044752
PCT Pub. Date: Mar. 27, 2014

(65) Prior Publication Data
US 2015/0270458 A1   Sep. 24, 2015

(30) Foreign Application Priority Data
Sep. 20, 2012   (DE) .......................... 10 2012 108 879

(51) Int. Cl.
*H01L 33/00* (2010.01)
*H01L 33/56* (2010.01)
(Continued)

(52) U.S. Cl.
CPC ............ *H01L 33/56* (2013.01); *H01L 33/0016* (2013.01); *H01L 33/08* (2013.01); *H01L 33/405* (2013.01); *H01L 33/60* (2013.01); *H01L 27/156* (2013.01); *H01L 33/44* (2013.01)

(58) Field of Classification Search
CPC ................. H01L 2224/48091; H01L 2924/00; H01L 2924/3025; H01L 2924/00014; H01L 2224/48247; H01L 25/0753; H01L 27/153; H01L 33/0079; H01L 33/382; H01L 33/48
USPC ............................ 257/88, 93, 98–99; 438/462
See application file for complete search history.

(56) References Cited

U.S. PATENT DOCUMENTS 8,698,178 B2   4/2014   Höppel et al.
8,860,063 B2 * 10/2014   Hoppel ................. H01L 33/382
257/98
(Continued)

FOREIGN PATENT DOCUMENTS

DE   102009033686 A1   1/2011
DE   102010009717 A1   9/2011
(Continued)

*Primary Examiner* — Mohammed Shamsuzzaman
(74) *Attorney, Agent, or Firm* — Slater & Matsil, L.L.P.

(57) ABSTRACT

An optoelectronic semiconductor chip is disclosed. The optoelectronic semiconductor chip includes a semiconductor layer sequence having an active zone suitable for emitting radiation, a carrier substrate, and a mirror layer, the mirror layer being arranged between the semiconductor layer sequence and the carrier substrate, wherein the semiconductor layer sequence is subdivided into a plurality of active regions arranged alongside one another, wherein the plurality of active regions are separated from one another in each case by a trench in the semiconductor layer sequence, wherein the trench in each case severs the semiconductor layer sequence and the mirror layer, wherein the mirror layer has side surfaces facing a trench and side surfaces facing an outer side of the semiconductor chip, wherein the side surfaces of the mirror layer that face an outer side of the semiconductor chip have a metallic encapsulation layer.

15 Claims, 4 Drawing Sheets

(51) Int. Cl.
*H01L 33/08* (2010.01)
*H01L 33/40* (2010.01)
*H01L 33/60* (2010.01)
H01L 27/15 (2006.01)
H01L 33/44 (2010.01)

(56) References Cited

U.S. PATENT DOCUMENTS

| | | | | |
|---|---|---|---|---|
| 8,866,175 B2* | 10/2014 | Engl | ................... | H01L 33/382 257/100 |
| 8,872,209 B2 | 10/2014 | Maute et al. | | |
| 2005/0062049 A1 | 3/2005 | Lin et al. | | |
| 2009/0283787 A1* | 11/2009 | Donofrio | .............. | H01L 33/405 257/98 |
| 2010/0081256 A1* | 4/2010 | Uemura | .............. | H01L 33/0079 438/462 |
| 2011/0049537 A1* | 3/2011 | Lee | ................... | H01L 25/0753 257/88 |
| 2011/0101390 A1* | 5/2011 | Engl | ................... | H01L 27/156 257/93 |
| 2011/0291120 A1 | 12/2011 | Tak et al. | | |
| 2012/0007118 A1* | 1/2012 | Choi | ................... | H01L 33/382 257/98 |
| 2013/0140598 A1* | 6/2013 | Hoppel | ................. | H01L 33/382 257/98 |
| 2013/0228798 A1 | 9/2013 | Höppel | | |
| 2013/0228819 A1* | 9/2013 | Engl | ................... | H01L 33/382 257/99 |

FOREIGN PATENT DOCUMENTS

| | | |
|---|---|---|
| DE | 102010033137 A1 | 2/2012 |
| DE | 102010044986 A1 | 3/2012 |
| DE | 102010045784 A1 | 3/2012 |
| EP | 2290689 A2 | 3/2011 |
| JP | 2011513957 A | 4/2011 |
| WO | 2011157523 A1 | 12/2011 |

* cited by examiner

FIG 2

OPTOELECTRONIC SEMICONDUCTOR CHIP HAVING A PLURALITY OF ACTIVE REGIONS ARRANGED ALONGSIDE ONE ANOTHER

This patent application is a national phase filing under section 371 of PCT/EP2013/069472, filed Sep. 19, 2013, which claims the priority of German patent application 10 2012 108 879.9, filed Sep. 20, 2012, each of which is incorporated herein by reference in its entirety.

TECHNICAL FIELD

The invention relates to an optoelectronic semiconductor chip having a plurality of active regions which are arranged alongside one another and can be connected in series, in particular.

BACKGROUND

The present application relates to a so-called thin-film light emitting diode chip, in which the original growth substrate of the semiconductor layer sequence is detached and instead the semiconductor layer sequence is connected to a carrier substrate, which is not identical to the growth substrate, at an opposite side relative to the original growth substrate. In the case of such a thin-film light emitting diode chip, it is advantageous if that side of the semiconductor layer sequence which faces the carrier substrate is provided with a mirror layer, in order that radiation emitted in the direction of the carrier substrate is deflected in the direction of the radiation exit surface and the radiation efficiency is thereby increased.

For the visible spectral range, silver, in particular, is suitable as material for the mirror layer since it is distinguished by a high reflection, but silver is sensitive to corrosion, on the other hand.

The document WO 2011/157523 A1 describes a thin-film light emitting diode chip in which the semiconductor layer has a plurality of active regions arranged alongside one another. The plurality of active regions arranged alongside one another are connected in series, in particular. The plurality of active regions are separated from one another by trenches in the semiconductor layer sequence. If a plurality of active regions of a semiconductor layer sequence are separated from one another by trenches between the active regions, this can have the effect that side flanks of a mirror layer arranged between the carrier substrate and the semiconductor layer sequence are exposed in the trenches. In order to avoid corrosion of the mirror layer as a result of contact with the ambient air and/or moisture in this case, exposed regions of the mirror layer are advantageously provided with an encapsulation layer.

It is possible to produce a plurality of such optoelectronic semiconductor components having in each case a plurality of active regions on a common carrier substrate, wherein the carrier substrate is separated along trenches between the active regions. It has been found that a dielectric encapsulation layer applied beforehand for protecting the mirror layer can be damaged during the process of separating the carrier substrate along the trenches between the active regions of the semiconductor layer sequence. This can have the effect that, after the singulation process, the side flanks of the mirror layer which face the outer sides of the respective semiconductor chips are not optimally protected against corrosion.

SUMMARY OF THE INVENTION

Embodiments of the invention specify an improved optoelectronic semiconductor chip having a plurality of active regions in which the side flanks of the mirror layer that face the outer sides of the semiconductor chip have improved protection against corrosion, wherein the efficiency of the semiconductor chip is impaired as little as possible.

In accordance with at least one configuration, the optoelectronic semiconductor chip comprises a semiconductor layer sequence containing an active zone suitable for emitting radiation. The optoelectronic semiconductor chip can be a light emitting diode chip, in particular.

Furthermore, the optoelectronic semiconductor chip comprises a carrier substrate. The optoelectronic semiconductor chip is preferably a so-called thin-film light emitting diode chip, in which the original growth substrate is detached from the semiconductor layer sequence and the semiconductor layer sequence is connected to the carrier substrate at the opposite side relative to the original growth substrate.

A mirror layer is advantageously arranged between the carrier substrate and the semiconductor layer sequence, said mirror layer preferably comprising silver or consisting thereof. Silver is distinguished by a high reflection in the visible spectral range. The mirror layer advantageously additionally forms an electrical contact with the semiconductor layer sequence. For this purpose, the high electrical conductivity of silver is advantageous.

In accordance with one configuration, the semiconductor layer sequence in the optoelectronic semiconductor chip is subdivided into a plurality of active regions which are arranged alongside one another and which are preferably connected in series. The plurality of active regions is connected in series, for example, by electrical contact layers, which are preferably arranged at least regionally between the carrier substrate and the mirror layer.

In the optoelectronic semiconductor chip, the plurality of active regions arranged alongside one another is advantageously separated from one another in each case by a trench in the semiconductor layer sequence. The trench in each case severs the semiconductor layer sequence and the mirror layer between the plurality of active regions. Therefore, each active region of the semiconductor chip is assigned a region of the mirror layer.

By virtue of the fact that the optoelectronic semiconductor chip is subdivided into a plurality of active regions by means of one or a plurality of trenches, the mirror layer has side surfaces facing a trench and side surfaces facing an outer side of the semiconductor chip.

In the optoelectronic semiconductor chip, the side surfaces of the mirror layer that face an outer side of the semiconductor chip advantageously have a metallic encapsulation layer. The metallic encapsulation layer comprises one or a plurality of layers composed of a metal or a metal alloy. The metallic encapsulation layer of the side surfaces of the mirror layer that face the outer sides of the semiconductor chip has the advantage that it has a comparatively high mechanical durability in comparison with a dielectric encapsulation layer. This is advantageous particularly if a plurality of the optoelectronic semiconductor chips are produced on a common carrier substrate and then the plurality of the optoelectronic semiconductor chips are divided by a singulation process such as sawing or laser beam cutting, for example, to form individual optoelectronic semiconductor chips. In such a singulation process, separating trenches are produced in the carrier substrate by sawing or laser beam cutting, for example, said separating trenches forming the outer sides of the semiconductor chip after singulation.

It has been found that damage to the encapsulation layer applied to the side surfaces of the mirror layer can occur during the production of the separating trenches if a dielectric encapsulation layer is used for the mirror layer. In such a case, the mirror layer would no longer be sufficiently protected against external influences such as, for example, the penetration of moisture and/or oxidation. This might lead to a degradation of the mirror layer, which, in the case of the optoelectronic semiconductor chip described herein, is advantageously avoided by the use of a metallic encapsulation layer for the side surfaces of the mirror layer that face the outer sides of the semiconductor chip.

Furthermore, in the optoelectronic semiconductor chip, at least one portion of the side surfaces of the mirror layer that face a trench advantageously has a dielectric encapsulation layer. In other words, at least some of the side surfaces of the mirror layer which face a trench between the plurality of active regions and not the outer side of the semiconductor chip are provided with a dielectric encapsulation layer. The dielectric encapsulation layer is advantageously transparent. This configuration is based on the insight that in the case of the side surfaces of the mirror layer which are arranged in the interior of the optoelectronic semiconductor chip and face a trench between the plurality of active regions, are substantially not impaired by the separating methods used during the singulation process. By virtue of the fact that at least one portion of the side surfaces of the mirror layer that face a trench has a dielectric encapsulation layer, absorption of the emitted electromagnetic radiation is reduced in comparison with a use of metallic encapsulation layers at all the side surfaces of the mirror layer, and the radiation efficiency of the optoelectronic semiconductor chip is advantageously increased in this way.

In one advantageous configuration of the optoelectronic semiconductor chip, all the side surfaces of the mirror layer that face a trench have a dielectric encapsulation layer. In this configuration, only the side surfaces of the mirror layer which face an outer side of the semiconductor chip are provided with a metallic encapsulation layer, while the remaining side surfaces of the mirror layer, which in each case face a trench arranged between the plurality of active regions, have a dielectric encapsulation layer. In this way, firstly, the side surfaces of the mirror layer that face the outer sides of the semiconductor chip are protected by the metallic encapsulation layer from mechanical damage, in particular during a singulation process. Secondly, at all the other side surfaces of the mirror layer, absorption of radiation is reduced by the use of an advantageously transparent dielectric encapsulation layer and the radiation efficiency is increased in this way.

In one configuration of the optoelectronic semiconductor chip, the active regions comprise at least one inner active region, in which all the side surfaces of the mirror layer in each case face a trench, and outer active regions, in which at least one side surface of the mirror layer faces an outer side of the semiconductor chip. The plurality of active regions can form, for example, a matrix composed of a plurality of rows and columns.

If the optoelectronic semiconductor chip comprises, for example, nine active regions arranged in a 3×3 matrix, in the inner active region arranged in the center all the side surfaces of the mirror layer in each case face a trench. In the remaining outer active regions in each case at least one side surface of the mirror layer faces an outer side of the optoelectronic semiconductor chip.

If the optoelectronic semiconductor chip comprises, for example, 16 active regions arranged in a 4×4 matrix, in the central four inner active regions all the side surfaces of the mirror layer in each case face a trench. In the remaining outer active regions in each case at least one side surface of the mirror layer faces an outer side of the optoelectronic semiconductor chip.

In one configuration of the optoelectronic semiconductor chip, the side surfaces of the mirror layer in the outer active regions, which face a trench and are adjacent to an outer side of the semiconductor chip at one side, have a metallic encapsulation layer in an outer region adjacent to the outer side and a dielectric encapsulation layer in an inner region facing away from the outer side. In this configuration, not just the side surfaces of the mirror layer that face the outer sides of the semiconductor chip have a metallic encapsulation layer, but also an outer region—adjacent to the outer side—of those side surfaces which adjoin an outer side of the semiconductor chip at one side. This advantageously reduces the risk of damage to the outer region—adjacent to the outer sides of the semiconductor chip—of said side surfaces of the mirror layer during a singulation process.

The metallic encapsulation layer advantageously extends from the outer side of the semiconductor chip at least 5 µm into the inner region of the semiconductor chip. An improved mechanical stability is obtained in the outer region in this way. However, the metallic encapsulation layer advantageously does not extend more than 10 µm into the semiconductor chip, such that the radiation efficiency is not significantly reduced by absorption. The outer region having the metallic encapsulation layer therefore preferably has a width of between 5 µm and 10 µm.

By virtue of the fact that a region—adjacent to the outer side of the semiconductor chip—of the side surface of the mirror layer is provided with a metallic encapsulation layer and the side surface moreover has a dielectric encapsulation layer, both good protection of the outer region adjacent to the outer side against mechanical damage and a reduction of the radiation absorption in the inner region are obtained.

In a further configuration, in the outer active regions all the side surfaces of the mirror layer which face a trench and which are adjacent to the outer side of the semiconductor chip at one side have a metallic encapsulation layer. In this configuration, in contrast to the configuration described previously, the side surfaces of the mirror layer that are adjacent to the outer side of the semiconductor chip at one side do not have partly a metallic and partly a dielectric encapsulation layer, but rather are provided with a metallic encapsulation layer over their entire width. The protection against mechanical damage is improved further in this way, although at the expense of at least slightly increased radiation absorption compared with the configuration described previously.

In a further configuration, in the outer active regions all the side surfaces of the mirror layer have a metallic encapsulation layer. In this configuration, only the side surfaces of the at least one inner active region that face a trench are provided with a dielectric encapsulation layer. In this way, the side surfaces of the mirror layer in the outer active regions are protected against mechanical damage as well as possible, although absorption of radiation occurs to a somewhat greater extent than in the case of the exemplary embodiments described previously.

In one preferred configuration, the dielectric encapsulation layer contains an aluminum oxide such as $Al_2O_3$, for example, or a silicon oxide such as $SiO_2$, for example, or consists thereof.

The dielectric encapsulation layer is preferably deposited in such a way that it is free of pores (referred to as pin holes). In particular, the encapsulation layer is advantageously deposited conformally, i.e., it covers the structure on which it is arranged, without the formation of interspaces. This can be achieved by means of a suitable method for conformal deposition from the gas phase.

In a further advantageous configuration, the dielectric encapsulation layer comprises a spin-on glass. A spin-on glass is advantageously distinguished by a low defect density and affords good protection against the penetration of moisture. The application of the dielectric encapsulation layer as spin-on glass furthermore has the advantage that the dielectric encapsulation layer can be introduced into small interspaces.

It is also possible, in particular, for the dielectric encapsulation layer to contain a plurality of sublayers which contain different dielectric materials and/or are produced by different production methods. The dielectric encapsulation layer can comprise, for example, a first sublayer, which is produced by means of deposition from the gas phase, and a second sublayer, which is a silicon dioxide layer produced by thermal decomposition of tetraethyl orthosilicate (TEOS).

The metallic encapsulation layer preferably comprises one or a plurality of layers composed of a metal or a metal alloy. The metallic encapsulation layer can be composed of a plurality of sublayers, which can contain different materials. In one preferred configuration, the metallic encapsulation layer contains at least one of the metals platinum, titanium or gold. By way of example, the metallic encapsulation layer can comprise three sublayers composed of platinum, titanium and gold.

In one preferred configuration, the mirror layer has a smaller lateral extent than the semiconductor layer sequence, wherein subregions of the dielectric encapsulation layer and/or of the metallic encapsulation layer extend below the semiconductor layer sequence. Particularly good protection of the mirror layer against oxidation and/or the penetration of moisture is obtained in this way. Preferably, the semiconductor layer sequence has a projection beyond the mirror layer at all side surfaces. The side surfaces of the mirror layer are advantageously adjoined by an interspace formed between the semiconductor layer sequence and a layer sequence applied to the carrier substrate. Said interspace is advantageously filled by the metallic and/or the dielectric encapsulation layer.

In a further advantageous configuration, the semiconductor layer sequence is completely covered by the dielectric encapsulation layer. In this configuration, the dielectric encapsulation layer covers not just a portion of the side surfaces of the mirror layer, but in particular also a main surface—facing away from the carrier substrate—of the semiconductor layer sequence and the side surfaces of the semiconductor layer sequence.

In one preferred configuration, the plurality of active regions form a matrix composed of a plurality of rows and columns. The matrix can have, for example, two, preferably at least three, or particularly preferably at least four rows. Furthermore, the matrix can have, for example, two, preferably at least three and particularly preferably at least four columns.

The plurality of active regions are preferably connected in series in the optoelectronic semiconductor chip. In this case, the voltage dropped across the optoelectronic semiconductor chip during the operation of the optoelectronic semiconductor chip is equal to the sum of the forward voltages of the plurality of active regions. If the optoelectronic semiconductor chip comprises a multiplicity of active regions, it can therefore be operated with an electrical voltage which is higher by a multiple than the voltage required during the operation of an individual active region. The optoelectronic semiconductor chip is therefore preferably a so-called high-voltage chip. By way of example, the optoelectronic semiconductor chip can have an operating voltage of at least 10 V, preferably at least 30 V or even at least 60 V.

BRIEF DESCRIPTION OF THE DRAWINGS

The invention is explained in greater detail below on the basis of exemplary embodiments in association with FIGS. 1 to 4.

In the figures.

Identical or identically acting component parts are provided with the same reference signs in each case in the figures. The illustrated component parts and the size relationships of the component parts among one another should not be regarded as true to scale.

DETAILED DESCRIPTION OF ILLUSTRATIVE EMBODIMENTS

Figure 1:
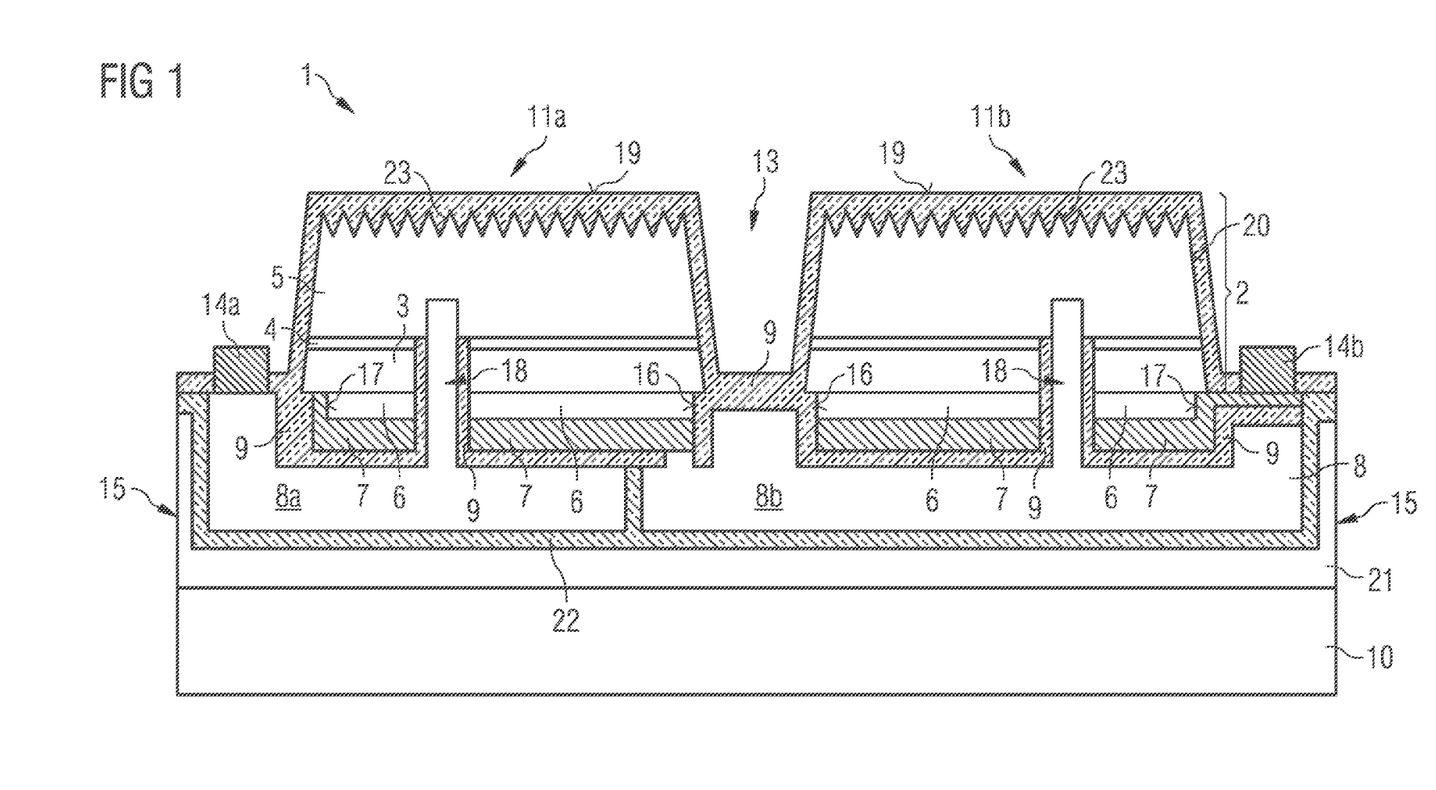
FIG. 1 shows a schematic illustration of a cross section through an optoelectronic semiconductor chip in accordance with a first exemplary embodiment.

The optoelectronic semiconductor chip 1 illustrated schematically in cross section in FIG. 1 comprises a semiconductor layer sequence 2, which is subdivided by a trench 13 into active regions 11a, 11b arranged alongside one another.

The semiconductor layer sequence 2 has a first semiconductor region 3 of a first conduction type and a second semiconductor region 5 of a second conduction type. Preferably, the first semiconductor region 3 is a p-type semiconductor region and the second semiconductor region 5 is an n-type semiconductor region. An active zone 4 is arranged between the first semiconductor region 3 and the second semiconductor region 5.

The active zone 4 of the optoelectronic semiconductor chip 1 is an active zone suitable for emitting radiation. The optoelectronic semiconductor chip 1 is a luminescence diode, in particular an LED. The active zone 4 can be embodied, for example, as a pn junction, as a double heterostructure, as a single quantum well structure or multiquantum well structure.

The semiconductor layer sequence 2 of the semiconductor chip 1 is preferably based on a III-V compound semiconductor material, in particular on an arsenide, nitride or phosphide compound semiconductor material. By way of example, the semiconductor layer sequence 2 can contain $In_xAl_yGa_{1-x-y}N$, $In_xAl_yGa_{1-x-y}P$ or $In_xAl_yGa_{1-x-y}As$, in each case where $0 \le x \le 1$, $0 \le y \le 1$ and $x+y \le 1$. In this case, the III-V compound semiconductor material need not necessarily have a mathematically exact composition according to one of the above formulae. Rather, it can comprise one or a plurality of dopants and additional constituents which substantially do not change the physical properties of the material. For the sake of simplicity, however, the formulae above only include the essential constituents of the crystal lattice, even if these can be replaced in part by small amounts of further substances.

The semiconductor chip 1 is connected to a carrier substrate 10 by means of a connection layer 21, which can be in particular a solder layer composed of a metal or a metal alloy.

For electrical contacting, the semiconductor chip 1 has a first electrical contact layer 7 and a second electrical contact layer 8. Both the first electrical contact layer 7 and the second electrical contact layer 8 are arranged at least regionally between a main surface of the semiconductor layer sequence 2 facing the carrier substrate 10 and the carrier substrate 10. The first electrical contact layer 7 and the second electrical contact layer 8 are electrically insulated from one another by means of an electrically insulating layer 9. The electrically insulating layer 9 preferably contains a silicon oxide, a silicon nitride, a silicon oxynitride, an aluminum oxide, or consists thereof. Alternatively, the electrically insulating layer 9 can also contain other oxides or nitrides.

The second main surface of the semiconductor layer sequence 2 situated opposite the carrier substrate 10 serves as a radiation coupling-out surface 19 of the optoelectronic semiconductor chip 1 and is advantageously free of electrical contact layers. In order to improve the coupling-out of radiation, the radiation coupling-out surface 19 can be provided with a coupling-out structure 23 or a roughening.

In order to improve the radiation efficiency of the optoelectronic semiconductor chip 1, a mirror layer 6 is arranged between the semiconductor layer sequence 2 and the carrier substrate 10. The mirror layer 6 is disposed downstream of the first semiconductor region 3 at the side facing the carrier substrate 10 and can adjoin in particular the semiconductor layer sequence 2. It is also possible for an intermediate layer, for example, a thin adhesion promoter layer, to be arranged between the first semiconductor region 3 and the mirror layer 6. The mirror layer 6 preferably contains silver or consists thereof. Silver is distinguished by a high reflectivity in the visible spectral range and a good electrical conductivity. The mirror layer 6 firstly has the function of reflecting radiation emitted in the direction of the carrier substrate 10 by the active zone 4 toward the radiation coupling-out surface 19. Furthermore, the mirror layer 6 also serves for electrically contacting the first semiconductor region 3. In particular, the mirror layer 6 adjoins the first electrical contact layer 7 at the side facing the carrier substrate 10 and is thus electrically conductively connected to the first electrical contact layer 7.

The first electrical contact layer 7 preferably covers the interface of the mirror layer facing the carrier substrate 10. The first electrical contact layer 7 preferably contains gold, titanium, chromium, platinum, titanium nitride, titanium tungsten nitride, or nickel, or consists thereof. These materials are distinguished by the fact that they are electrically conductive and in addition chemically inert. In this way, the mirror layer 6 is advantageously protected against corrosion in the regions in which it is covered by the first electrical contact layer 7.

The second electrical contact layer 8 is electrically conductively connected to the second semiconductor region 5 by a perforation 18 running through the first semiconductor region 3 and the active zone 4. In the region of the perforation 18, the active zone 4, the first semiconductor region 3, the mirror layer 6 and the first electrical contact layer 7 are insulated from the second electrical contact layer 8, for example, by means of the electrically insulating layer 9.

The second electrical contact layer 8, in the regions in which it directly adjoins the semiconductor layer sequence 2, advantageously functions not only as contact layer but also as reflective layer that reflects radiation toward the second main surface of the semiconductor layer sequence 2, said second main surface serving as the radiation exit surface. The second electrical contact layer 8 therefore advantageously comprises a metal or a metal alloy having a high reflectivity, in particular silver, aluminum or an alloy comprising silver or aluminum.

The active regions 11a, 11b of the optoelectronic semiconductor chip 1 are preferably connected in series. The optoelectronic semiconductor chip 1 comprises a first connection contact 14a and a second connection contact 14b, for example, which are, for example, in each case a bonding pad arranged alongside the semiconductor layer sequence 2. In the exemplary embodiment, the first connection contact 14a is connected to the second semiconductor region 5 of a first active region 11a via a subregion 8a of the second electrical contact layer 8. The second semiconductor region 5 is, for example, the n-type semiconductor region of the first active region 11a. The first semiconductor region 3, for example, the p-type semiconductor region of the first active region 11a, is electrically conductively connected to the second semiconductor region 5 of the second active region 11b via the mirror layer 6, the first electrical contact layer 7 and a subregion 8b of the second electrical contact layer 8. The first semiconductor region 3 of the second active region 11b is electrically conductively connected to the second connection contact 14b via a region of the first electrical contact layer 7. The regions 8a, 8b of the second electrical contact layer 8 are electrically insulated among one another and from the solder layer 21 by means of an electrically insulating layer 22. In this way, by way of example, the first active region 11a and the second active region 11b are connected in series.

In the exemplary embodiment, only a series circuit formed by two active regions 11a, 11b is illustrated, in order to simplify the illustration. In a modification of the exemplary embodiment, a multiplicity of further active regions can be connected in series by means of a suitable structuring of the electrical contact layers 7, 8. In particular, the plurality of active regions 11a, 11b can be arranged in a matrix composed of rows and columns.

The trench 13 between the active regions 11a, 11b severs the semiconductor layer sequence 2 and the mirror layer 6 between the active regions 11a, 11b. The mirror layer 6 therefore has side surfaces 16 facing the trench 13. The side surfaces 16 of the mirror layer 6 that face the trench 13 are provided with a dielectric encapsulation layer 9 for protection against environmental influences, in particular for protection against the penetration of moisture and against oxidation. The dielectric encapsulation layer 9 preferably contains an aluminum oxide or a silicon oxide or consists thereof. In particular, the dielectric encapsulation layer 9 can be an $SiO_2$ layer.

The dielectric encapsulation layer 9 can have a double function and simultaneously form the electrically insulating layer 9 between the first contact layer 7 and the second contact layer 8. Furthermore, the dielectric encapsulation layer 9 advantageously also covers the side surfaces 20 of the semiconductor layer sequence and the radiation exit surface 19. The semiconductor layer sequence 2 is therefore advantageously completely covered by the dielectric encapsulation layer 9. Advantageously, fine cracks possibly present at the surfaces of the semiconductor layer sequence 2 can be closed by the dielectric encapsulation layer 9. The complete encapsulation of the semiconductor layer sequence 2 is therefore advantageous for the long-term stability of the semiconductor chip 1.

The dielectric encapsulation layer 9 preferably comprises a layer which is produced by means of deposition from the gas phase, is free of pores and conformally covers the structure to which it is applied. The dielectric encapsulation layer 9 may also be deposited as spin-on glass. Such a dielectric encapsulation layer 9 deposited by means of conformal deposition from the gas phase or as spin-on glass advantageously has a high resistance to corrosion and the penetration of moisture.

The dielectric encapsulation layer 9 can comprise a plurality of sublayers. By way of example, the dielectric encapsulation layer 9 can comprise a first sublayer, which is produced by means of deposition from the gas phase and directly adjoins the side surface 16 of the mirror layer 6, and a second sublayer arranged thereabove. In this case, the second sublayer can, for example, comprise a different material and/or be produced by means of a different coating method. It is possible, for example, for at least one sublayer to comprise a silicon dioxide layer produced by means of thermal decomposition of tetraethyl orthosilicate (TEOS).

The active regions 11a, 11b in the optoelectronic semiconductor chip 1 in FIG. 1 in each case face an outer side 15 of the semiconductor chip 1 at one side. Therefore, the mirror layer 6 of the subregions 11a, 11b has in each case a side surface 17 facing the outer side 15 of the semiconductor chip 1. The side surfaces 17 of the mirror layer 6 that face the outer sides 15 of the semiconductor chip 1 advantageously have in each case a metallic encapsulation layer 7. The metallic encapsulation layer 7 contains at least one layer composed of a metal or a metal alloy. The metallic encapsulation layer 7 can also be formed from a plurality of sublayers each comprising a metal or a metal alloy. Preferably, the metallic encapsulation layer contains at least one of the metals platinum, titanium or gold. In particular, the metallic encapsulation layer 7 can comprise a layer sequence containing a platinum layer, a gold layer and a titanium layer.

In the exemplary embodiment, the metallic encapsulation layer 7 simultaneously functions as the first electrical contact layer 7 of the optoelectronic semiconductor chip 1. The metallic encapsulation layer 7 advantageously has a double function. In its property as first electrical contact layer 7 it contacts the opposite side of the mirror layer 6 relative to the semiconductor layer sequence 2. At the side surfaces 17 of the mirror layer 6 that face the outer sides 15 of the semiconductor chip 1, the metallic encapsulation layer 7 covers the side surfaces 17 and in this way protects the side surfaces 17 against corrosion, in particular the penetration of moisture and/or oxidation.

The metallic encapsulation layer 7 furthermore has the advantage that it protects the side surfaces 17 of the mirror layer 6 that face the outer sides 15 of the semiconductor chip 1 against mechanical damage. This is advantageous particularly if the optoelectronic semiconductor chip 1 is produced with a multiplicity of further optoelectronic semiconductor chips on a wafer which is separated to form individual optoelectronic semiconductor chips 1 by means of a singulation process such as sawing or laser beam cutting, for example. The outer sides 15 of the optoelectronic semiconductor chip 1 can be separation surfaces, in particular, which were produced by means of a separating process such as laser beam cutting or sawing, for example. It has been found that in the case of an encapsulation of the mirror layer 6 with a dielectric encapsulation layer at the outer sides 15 of the semiconductor chip 1, mechanical damage to the encapsulation layer can possibly occur. Such a possible impairment of the encapsulation layer is prevented by the use of a metallic encapsulation layer 7 at the side surfaces 17 of the mirror layer 6 that face the outer side 15 of the semiconductor chip 1.

Since the side surfaces 16 of the mirror layer 6 that face the trenches 13 do not face a separation surface, at these side surfaces 16 of the mirror layer 6 a dielectric encapsulation layer 9 affords sufficient protection of the mirror layer 6. The dielectric encapsulation layer 9 covering the side surfaces 16 of the mirror layer 6 that face the trenches 13 is advantageously transparent to the radiation emitted by the active zone 4. This has the advantage that radiation emitted in the direction of the dielectric encapsulation layer 9 can penetrate through the encapsulation layer and is reflected at the mirror layer 6 and/or the second electrical contact layer 8 in the direction of a radiation exit surface 19 of the optoelectronic semiconductor chip 1. Therefore, the radiation efficiency of the optoelectronic semiconductor chip 1 is advantageously increased by the use of a transparent dielectric encapsulation layer 9 at the side surfaces 16 of the mirror layer 6 that face the trenches 13.

At the outer sides 15 of the semiconductor chip, by contrast, at least slight absorption of radiation in the metallic encapsulation layer 7 covering the side surfaces 17 of the mirror layer 6 is accepted in favor of an improved mechanical stability. By virtue of the use of a dielectric encapsulation layer 9 at the side surfaces 16 of the mirror layer 6 that face the at least one trench 13 between the active regions 11a, 11b and the use of a metallic encapsulation layer 7 at the side surfaces 17 of the mirror layer 6 that face the outer side 15, a high radiation efficiency is obtained without the mechanical stability being impaired in the critical regions of the side surfaces 17 of the mirror layer 6 that face the outer sides 15.

In one particularly preferred configuration, the mirror layer 6 has a smaller lateral extent than the semiconductor layer sequence 2, such that subregions of the dielectric encapsulation layer 9 and/or of the metallic encapsulation layer 7 extend below the semiconductor layer sequence 2. In this configuration, the side surfaces 16, 17 of the mirror layer 6 are advantageously spaced apart from the side surfaces 20 of the semiconductor layer sequence 2. The distance between the side surfaces 20 of the semiconductor layer sequence 2 and the side surfaces 16, 17 of the mirror layer 6 is preferably between 0.5 µm and 5 µm, particularly preferably approximately 3 µm. The mirror layer 6 is protected particularly effectively in this way.

In the case of the optoelectronic semiconductor chip 1, the plurality of active regions can be arranged in a matrix composed of a plurality of rows and columns. Preferably, all the active regions of the plurality of rows and columns are connected in series. In this case, the operating voltage of the optoelectronic semiconductor chip is equal to the sum of the operating voltages of the multiplicity of active regions. The operating voltage of the optoelectronic semiconductor chip can be, for example, 10 V or more, 30 V or more, or even 60 V or more.

Figure 2:
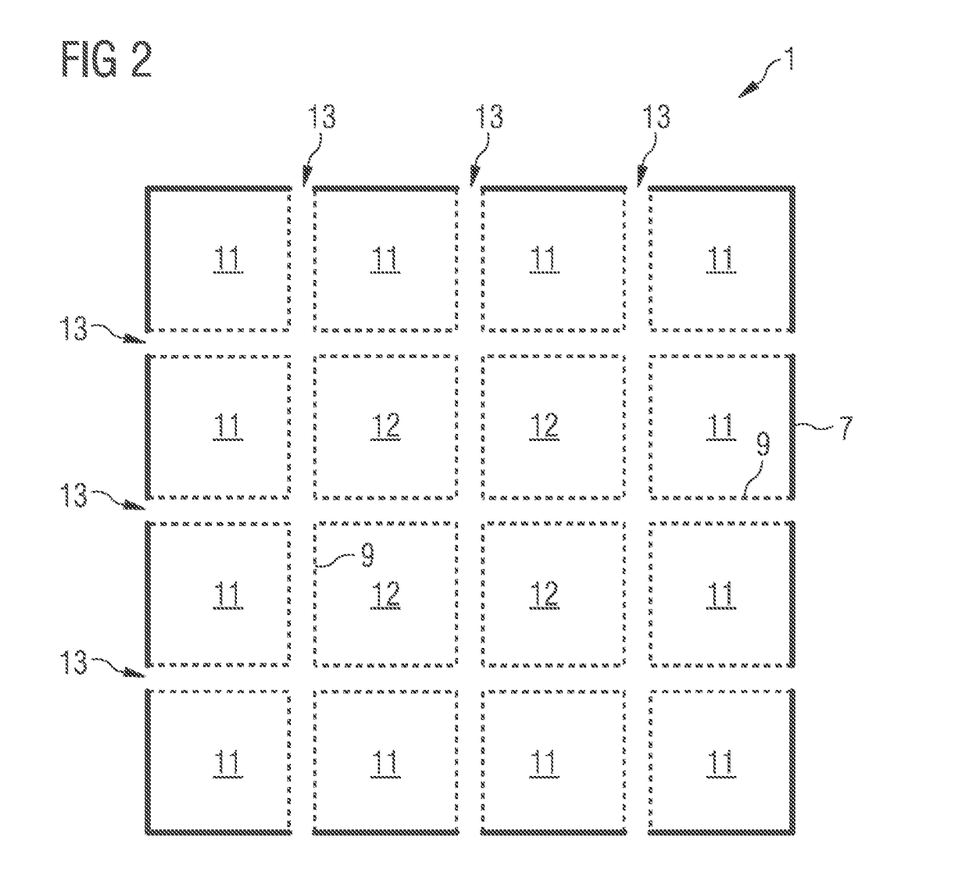
FIG. 2 shows a schematic illustration of the arrangement of the active regions and the encapsulation layers in an optoelectronic semiconductor chip in accordance with a second exemplary embodiment in a plan view.
Figure 3:
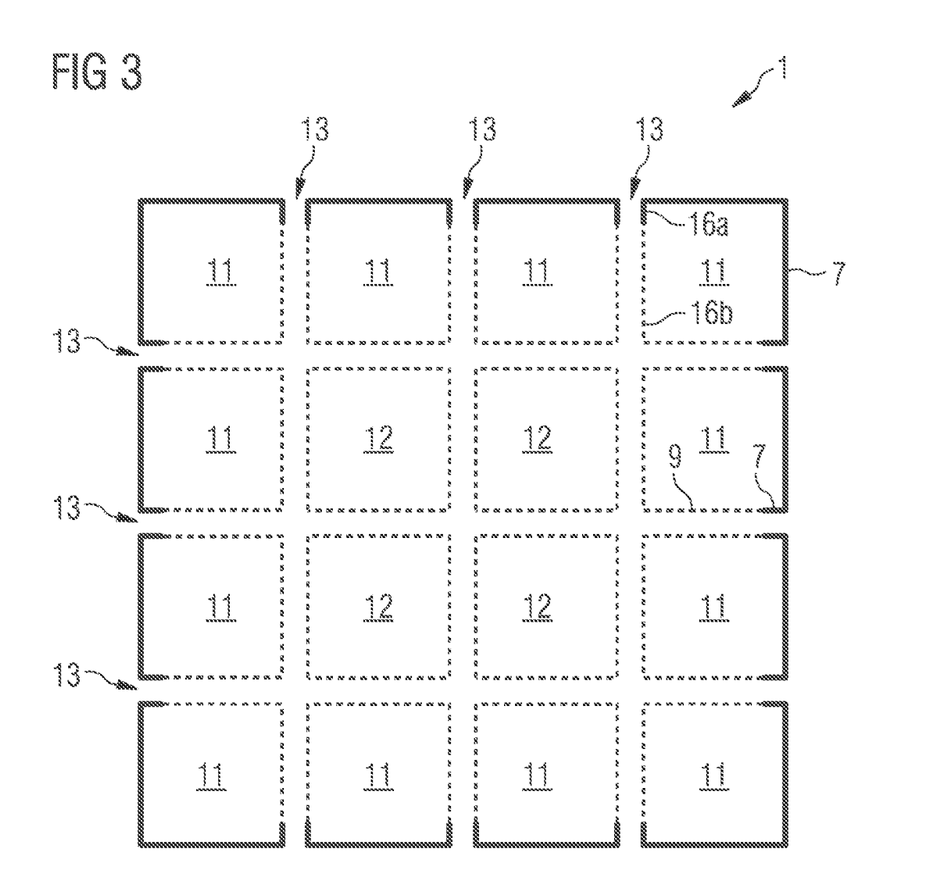
FIG. 3 shows a schematic illustration of the arrangement of the active regions and the encapsulation layers in an optoelectronic semiconductor chip in accordance with a third exemplary embodiment in a plan view.
Figure 4:
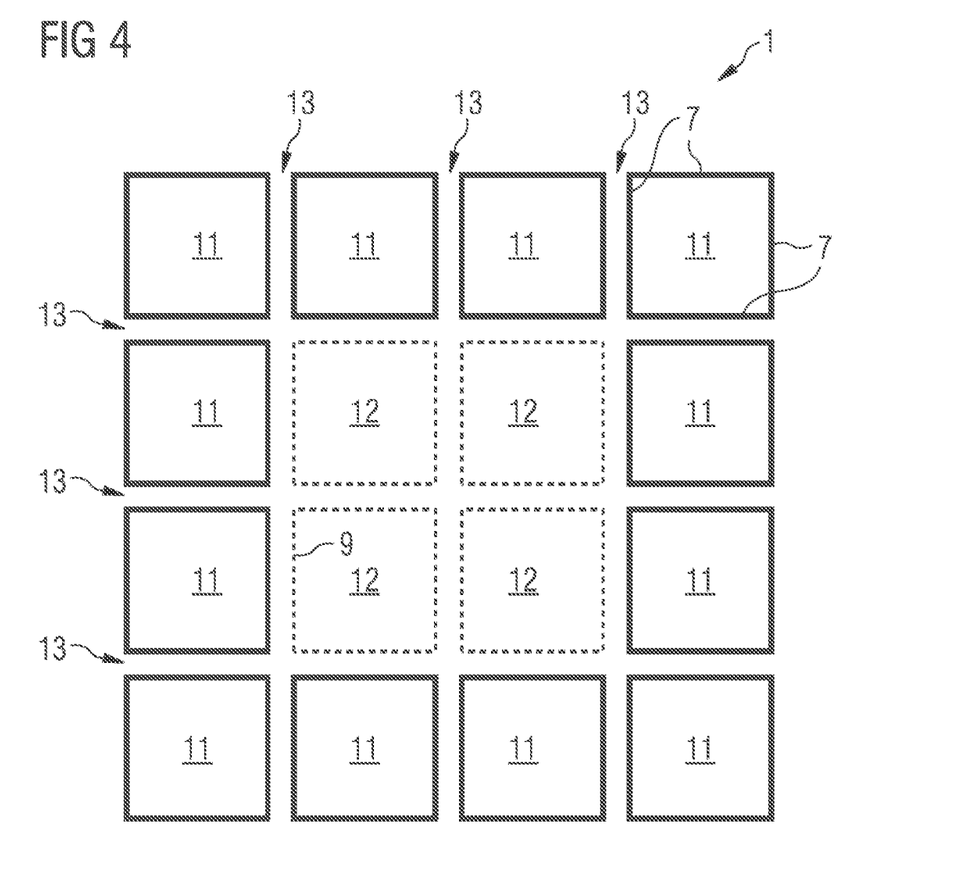
FIG. 4 shows a schematic illustration of the arrangement of the active regions and the encapsulation layers in an optoelectronic semiconductor chip in accordance with a fourth exemplary embodiment in a plan view.

The following FIGS. 2, 3 and 4 illustrate exemplary embodiments of an optoelectronic semiconductor chip 1 in which the optoelectronic semiconductor chip 1 comprises in each case 16 active regions 11, 12 arranged in four rows and four columns.

FIG. 2 schematically shows a plan view of one exemplary embodiment of the optoelectronic semiconductor chip 1. In order to simplify the illustration, only the contours of the active regions 11, 12 are illustrated. The active regions 11, 12 are separated from one another by trenches 13. The contours of the active regions 11, 12 are illustrated partly by solid black lines and partly by dotted black lines. The solid black lines symbolize the fact that the mirror layer of the respective active region 11, 12 is provided with a metallic encapsulation layer 7 at this side surface. The dotted black lines symbolize the fact that the mirror layer of the active regions 11, 12 is provided with a dielectric encapsulation layer 9 at this side surface.

The optoelectronic semiconductor chip 1 in accordance with the exemplary embodiment in FIG. 2 has outer active regions 11, in which at least one outer surface of the active region 11 adjoins an outer side of the optoelectronic semiconductor chip 1. Furthermore, the active regions have inner active regions 12, which face a trench 13 toward all sides.

In the outer active regions 11, all side surfaces of the mirror layer that face an outer side of the semiconductor chip 1 have a metallic encapsulation layer 7. The side surfaces of the mirror layer that face the trenches 13 have in each case a dielectric encapsulation layer 9. In the inner active regions 12, all the side surfaces of the mirror layer face a trench 13, wherein all the side surfaces of the mirror layer are provided with a dielectric encapsulation layer 9.

In this way, the side surfaces of the mirror layer that face the outer sides of the semiconductor chip 1 are protected against mechanical damage by means of the metallic encapsulation layer, wherein a reduction of the absorption of radiation is simultaneously obtained on account of the dielectric encapsulation layer 9 on the side surfaces of the mirror layer that face the trenches 13.

FIG. 3 illustrates a modification of the exemplary embodiment illustrated in FIG. 2. As in the case of the exemplary embodiment in FIG. 2, in the outer active regions 11 all side surfaces of the mirror layer that face an outer side of the optoelectronic semiconductor chip 1 are provided with a metallic encapsulation layer 7. In the inner active regions 12, all side surfaces of the mirror layer are provided with a dielectric encapsulation layer 9.

In contrast to the exemplary embodiment illustrated in FIG. 2, the side surfaces of the mirror layer in the outer active regions 11 that face a trench 13 are not provided with a dielectric mirror layer 9 over the whole area. Rather, the side surfaces of the mirror layer in the outer active regions 11, which face a trench 13 and adjoin an outer side of the semiconductor chip 1 at one side, are provided with a metallic encapsulation layer 7 in a first region 16a adjacent to the outer side and with a dielectric encapsulation layer 9 in a second region 16b. In this configuration, therefore, in the outer active regions 11, not just the side surfaces of the mirror layer that face an outer side of the semiconductor chip 1 have a metallic encapsulation layer 7, but also a region—adjacent to the outer side—of those side surfaces of the mirror layer which face a trench 13. In this way, the regions 16a of the side surface of the mirror layer that are adjacent to the outer side are advantageously also protected against mechanical damage.

The regions 16a of the side surfaces of the mirror layer which are adjacent to the outer side of the semiconductor chip 1 and which are provided with a metallic encapsulation layer 7 preferably have a width of between 5 µm and 10 µm. In other words, the metallic encapsulation layer 7 extends from the outer sides in each case at least 5 µm and at most into the interior of the optoelectronic semiconductor chip 1. In this configuration, improved mechanical protection of the mirror layer in the vicinity of the outer sides of the semiconductor chip is advantageously obtained, without a significant increase in absorption in the metallic encapsulation layer 7 appearing in this case.

A further modification of the exemplary embodiment illustrated in FIG. 2 is illustrated in FIG. 4. In this configuration, in the outer active regions 11, all side surfaces of the mirror layer are provided with a metallic encapsulation layer 7. In the inner active regions 12, in which the mirror layer in each case faces a trench 13, the mirror layer is provided in each case with a dielectric encapsulation layer 9. Since the mirror layer of the outer active regions 11 in this configuration is provided in each case completely circumferentially with a metallic encapsulation layer 7, the mirror layer in the outer active regions 11 is protected particularly well against mechanical damage. However, in this configuration in comparison with the two previous exemplary embodiments it is necessary to accept a somewhat greater absorption of radiation at the side surfaces of the mirror layer that face the trenches 13 in the outer active regions 11.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor chip comprising:
    a semiconductor layer sequence having an active zone suitable for emitting radiation;
    a carrier substrate; and
    a mirror layer arranged between the semiconductor layer sequence and the carrier substrate,
    wherein the semiconductor layer sequence is subdivided into a plurality of active regions arranged alongside one another, wherein the plurality of active regions are separated from one another in each case by a trench in the semiconductor layer sequence, wherein the trench in each case severs the semiconductor layer sequence and the minor layer,
    wherein the mirror layer has side surfaces facing trenches and side surfaces facing outer sides of the semiconductor chip, wherein the side surfaces of the mirror layer that face the outer sides of the semiconductor chip comprise a metallic encapsulation layer, wherein at least one portion of the side surfaces of the mirror layer that face the trenches comprises a dielectric encapsulation layer, and wherein the dielectric encapsulation layer partially fills the trenches.

2. The optoelectronic semiconductor chip according to claim 1, wherein all the side surfaces of the mirror layer facing the trenches comprise the dielectric encapsulation layer.

3. The optoelectronic semiconductor chip according to claim 1, wherein the active regions comprise at least one inner active region, in which all the side surfaces of the mirror layer in each case face the trenches, and outer active regions, in which at least one side surface of the mirror layer faces an outer side of the semiconductor chip.

4. The optoelectronic semiconductor chip according to claim 3, wherein side surfaces of the mirror layer in the outer active regions facing the trenches and being adjacent to the outer side of the semiconductor chip comprise the metallic encapsulation layer in an outer region adjacent to the outer side and comprise the dielectric encapsulation layer in an inner region.

5. The optoelectronic semiconductor chip according to claim 4, wherein the outer region which is adjacent to the outer side and which comprises the metallic encapsulation layer has a width of between 5 µm and 10 µm.

6. The optoelectronic semiconductor chip according to claim 3, wherein in the outer active regions all the side surfaces of the mirror layer facing the trenches and being adjacent to the outer side of the semiconductor chip at one side comprises the metallic encapsulation layer.

7. The optoelectronic semiconductor chip according to claim 3, wherein in the outer active regions all the side surfaces of the mirror layer comprises the metallic encapsulation layer.

8. The optoelectronic semiconductor chip according to claim 1, wherein the dielectric encapsulation layer contains an aluminum oxide or a silicon oxide.

9. The optoelectronic semiconductor chip according to claim 1, wherein the dielectric encapsulation layer is free of pores.

10. The optoelectronic semiconductor chip according to claim 1, wherein the metallic encapsulation layer comprises at least one layer composed of a metal or a metal alloy.

11. The optoelectronic semiconductor chip according to claim 1, wherein the metallic encapsulation layer comprises at least one of platinum, titanium or gold.

12. The optoelectronic semiconductor chip according to claim 1, wherein the mirror layer has a smaller lateral extent than the semiconductor layer sequence, and partial regions of at least one of the dielectric encapsulation layer and the metallic encapsulation layer extends below the semiconductor layer sequence.

13. The optoelectronic semiconductor chip according to claim 1, wherein the semiconductor layer sequence is completely covered by the dielectric encapsulation layer.

14. The optoelectronic semiconductor chip according to claim 1, wherein the plurality of active regions form a matrix composed of a plurality of rows and columns.

15. The optoelectronic semiconductor chip according to claim 1, wherein the plurality of active regions are connected in series.

* * * * *

UNITED STATES PATENT AND TRADEMARK OFFICE
CERTIFICATE OF CORRECTION

PATENT NO. : 9,299,897 B2
APPLICATION NO. : 14/428333
DATED : March 29, 2016
INVENTOR(S) : Lutz Hoeppel et al.

Page 1 of 1

It is certified that error appears in the above-identified patent and that said Letters Patent is hereby corrected as shown below:

In the Claims

In Col. 12, line 25, claim 1, delete "minor" and insert --mirror--.

Signed and Sealed this
Seventh Day of June, 2016

Michelle K. Lee
*Director of the United States Patent and Trademark Office*